United States Patent
Hsu et al.

(10) Patent No.: US 8,254,066 B2
(45) Date of Patent: Aug. 28, 2012

(54) TECHNIQUE FOR MEASURING PROCESS INDUCED MAGNETIC ANISOTROPY IN A MAGNETORESISTIVE SENSOR

(75) Inventors: Yimin Hsu, Sunnyvale, CA (US); Arley Cleveland Marley, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 662 days.

(21) Appl. No.: 12/345,745

(22) Filed: Dec. 30, 2008

(65) Prior Publication Data
US 2010/0166943 A1 Jul. 1, 2010

(51) Int. Cl.
*G11B 5/33* (2006.01)

(52) U.S. Cl. .............. 360/324.12; 324/207.21

(58) Field of Classification Search ............ 360/324, 360/324.1; 324/210, 249, 207.21, 301, 389, 324/244, 251, 257, 252
See application file for complete search history.

(56) References Cited

U.S. PATENT DOCUMENTS

| | | | |
|---|---|---|---|
| 5,408,377 A | 4/1995 | Gurney et al. ............... 360/113 |
| 6,504,688 B2 * | 1/2003 | Hasegawa et al. ........ 360/324.11 |
| 6,580,587 B1 * | 6/2003 | Everitt .......................... 360/324 |
| 6,965,229 B2 * | 11/2005 | Duan et al. .................... 324/210 |
| 7,177,121 B2 | 2/2007 | Kojima et al. ........... 360/324.12 |
| 7,206,175 B2 | 4/2007 | Morinaga et al. ........ 360/324.12 |
| 7,209,326 B2 | 4/2007 | Nishioka et al. ......... 360/324.11 |
| 7,209,327 B2 | 4/2007 | Ookawa et al. ......... 360/324.12 |
| 7,848,065 B2 * | 12/2010 | Freitag et al. ............ 360/324.12 |
| 2005/0162786 A1 | 7/2005 | Meguro et al. ............ 360/324.2 |
| 2006/0028770 A1 | 2/2006 | Etoh et al. .................... 360/313 |
| 2006/0103991 A1 | 5/2006 | Hoshino et al. ......... 360/324.12 |
| 2006/0158793 A1 | 7/2006 | Arasawa et al. ......... 360/324.12 |
| 2007/0008661 A1 * | 1/2007 | Min et al. .................. 360/324.1 |
| 2007/0109692 A1 | 5/2007 | Carey et al. .............. 360/324.1 |

OTHER PUBLICATIONS

Sangmun Oh et al., "The behavior of pinned layers using a high-field transfer curve" IEEE Transactions on Magnetics, vol. 41, Issue 10, Oct. 2005, pp. 2950-2952.

\* cited by examiner

*Primary Examiner* — Patrick Assouad
*Assistant Examiner* — Alesa Allgood
(74) *Attorney, Agent, or Firm* — Zilka-Kotab, PC

(57) ABSTRACT

A method for determining a magnetic anisotropy of a free layer of a magnetoresistive sensor. The method includes forming a functional magnetoresistive sensor and also a test sensor on a wafer. The test sensor has a sensor stack that is identical to that of the functional sensor, however the test head does not have a magnetic bias structure for biasing the free layer. A series of tests can be performed to construct a transfer curve for the test sensor. This can then be used to determine a magnetic anisotropy of the test head, which also corresponds to a magnetic anisotropy of the functional head.

12 Claims, 6 Drawing Sheets

TECHNIQUE FOR MEASURING PROCESS INDUCED MAGNETIC ANISOTROPY IN A MAGNETORESISTIVE SENSOR

FIELD OF THE INVENTION

The present invention relates to the manufacture of magnetoresistive read sensors and more particularly to a method for manufacturing a sensor that allows process induced magnetic free layer anisotropy to be determined during manufacture.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

SUMMARY OF THE INVENTION

The present invention provides a method for determining process induced magnetic anisotropy in a magnetoresistive sensor. The method includes forming a functional magnetoresistive sensor and a test magnetoresistive sensor on a wafer. Magnetic testing is then performed on the test magnetoresistive sensor to construct a transfer curve for the test magnetoresistive sensor.

The transfer curve can then be used to determine a magnetic anisotropy in the test sensor, which corresponds to the magnetic anisotropy in the functional sensor. The functional sensor and test sensor can be formed in simultaneous, common manufacturing processes so that they have substantially identical sensor stacks. The test sensor can, therefore, be substantially identical to the functional sensor, except that the test sensor has no magnetic bias structure. This absence of a hard bias structure in the test head allows the magnetic anisotropy to be accurately determined.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
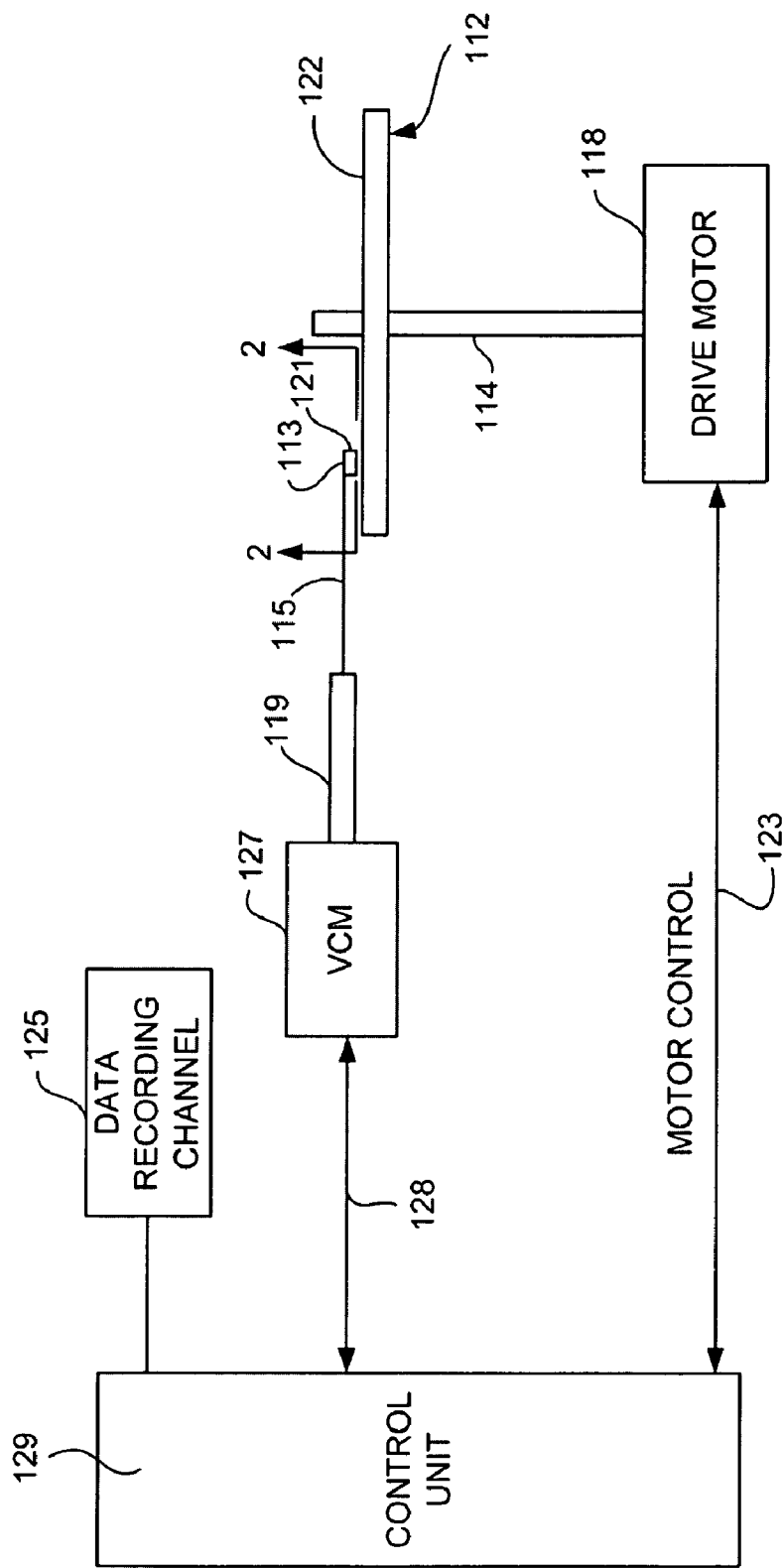
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As tile magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
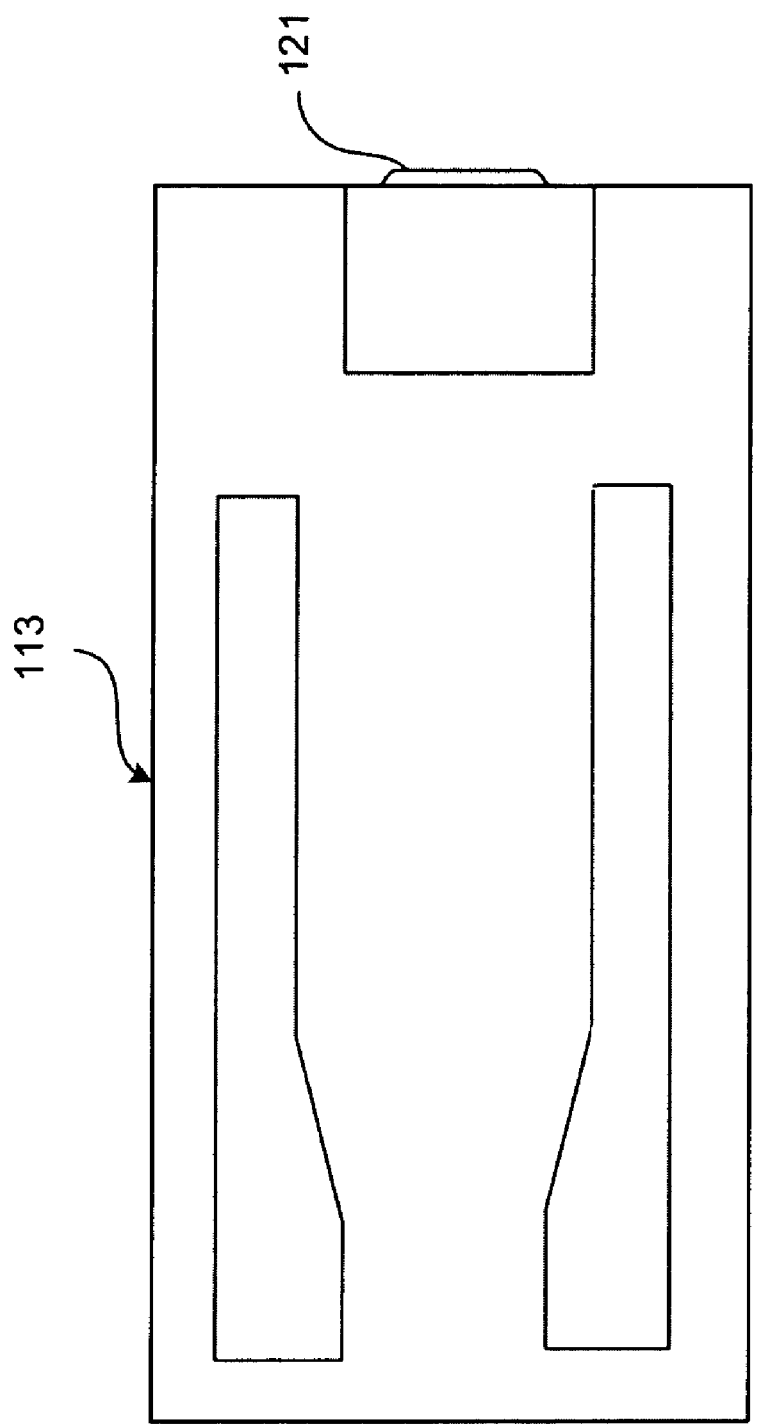
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
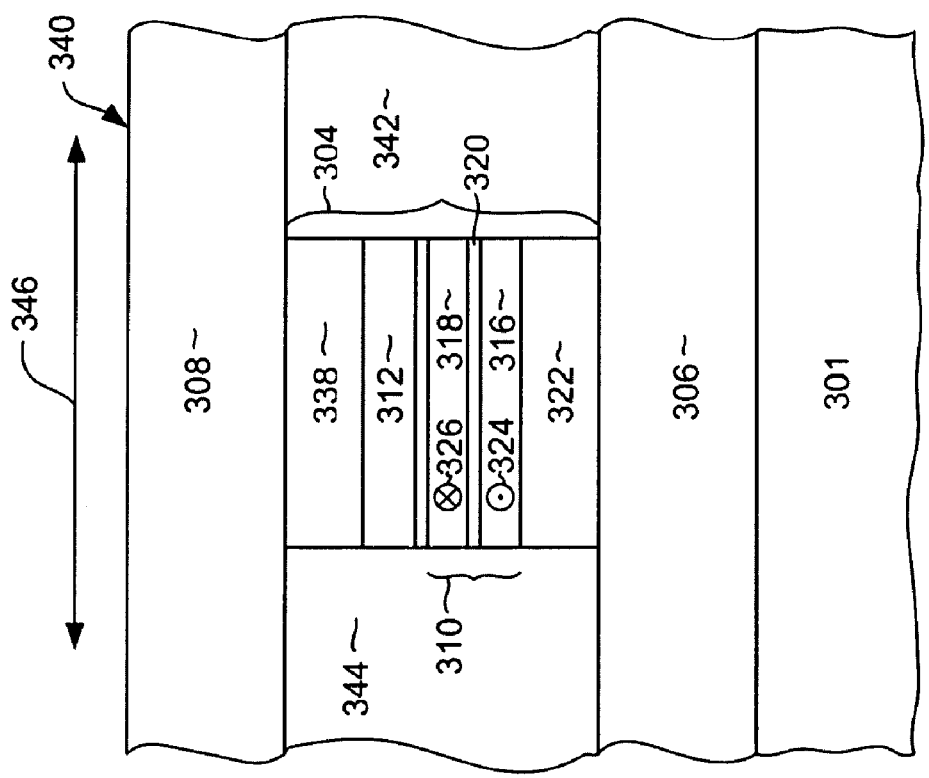
FIG. 3 is an enlarged ABS view of a magnetoresistive sensor of a magnetic head for use in disk drive system.
Figure 3:
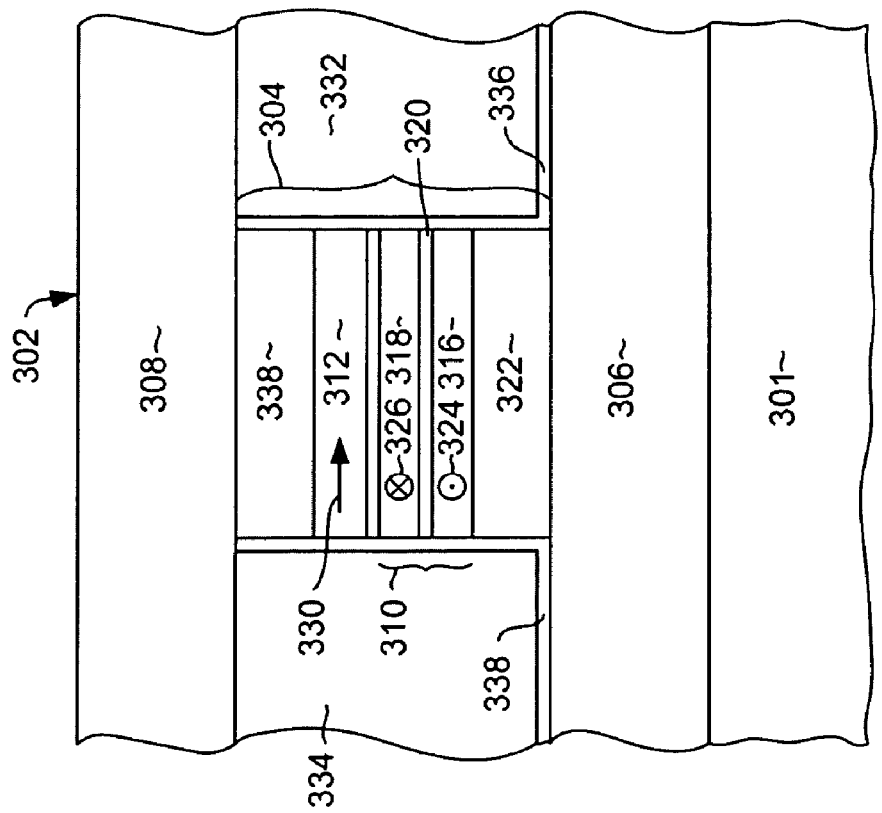

With reference now to FIG. 3, a magnetoresistive sensor 302 is described, which can be formed on a magnetic head, such as the head 121 of FIG. 2. The magnetoresistive sensor 302 can include a sensor stack 304 sandwiched between first and second magnetic shields 306, 308. The magnetic shields 306, 308 can be constructed of an electrically conductive, magnetic material such as NiFe or CoFe so that they can sense as electrical leads for supplying a sense current to the sensor stack 304, as well as providing a magnetic shielding function. The read head 320 is constructed on a wafer 301 that is subsequently sliced and lapped to form a body of a slider 113 as shown in FIG. 1.

The sensor stack 304 can include a magnetic pinned layer structure 310, a magnetic free layer structure 312 and a non-magnetic spacer or barrier layer 314 sandwiched between the pinned layer structure 310 and the free layer 312. The sensor 302 could be constructed as a GMR sensor, in which case the layer 314 would be an electrically conductive spacer layer such as Cu. Alternatively the sensor could also be a tunnel valve, in which case the layer 314 would be a thin, non-magnetic, electrically insulating barrier layer such as MgOx.

The pinned layer structure 310 can be an antiparallel coupled structure including first and second magnetic layers 316,318 and an antiparallel coupling layer 320 sandwiched between the magnetic layers 316, 318. A layer of antiferromagnetic material 322 such as IrMn or PtMn can provided adjacent to the pinned layer structure 310. Exchange coupling between the antiferromagnetic layer 322 and the first magnetic layer 316 pins the magnetization of the first magnetic layer in a first direction perpendicular to the air bearing surface as indicated by arrow tail symbol 324. Antiparallel coupling between the first magnetic layer 316 and the second magnetic layer 318 pins the magnetization of the second magnetic layer 318 in a second direction antiparallel to the first as indicated by arrow head symbol 326.

A capping layer 328, such as Ta, may be provided at the top of the sensor stack 304 to protect the sensor layers during manufacture. The free layer 312 has a magnetization that is biased in a direction substantially parallel with the air bearing surface as indicated by arrow symbol 330. Although this magnetization 330 of the free layer 312 is biased to be parallel with the air bearing surface in the absence of an external magnetic field, it is free to rotate in response to an external magnetic field, such as that from a magnetic medium 112 (FIG. 1). As this magnetization moves in response to such a magnetic field, the orientation of the magnetization 330 relative to the magnetization 326 results in a change in electrical resistance across the layer 314.

In order to bias the magnetization 330 in the desired direction parallel with the air bearing surface, first and second hard bias layers 332 334 can be provided at either side of the sensor stack 304. The bias layers can be constructed of a hard magnetic material such as CoPt or CoPtCr, and when magnetized they provide a magnetic bias field that keeps the magnetization 330 biased in the desired direction. In order to prevent sense current from being shunted through the bias layers 332, 334, insulation layers 336, 338 can be provided to separate the bias layers 332, 334 from the sensor stack 304 and at least one of the shields 306. The insulation layers can be constructed of a material such as alumina and can be deposited by atomic layer deposition (ALD). The insulation layers 336, 338 should be thin enough to allow for effective free layer biasing.

In order for a sensor to function properly, it is necessary that magnetization 330 of the free layer 312 remain biased parallel to the air bearing surface. However certain manufacturing variances compromise the stability of free layer biasing. For example, as those skilled in the art will appreciate, the air bearing surface of a slider is formed by a lapping operation. This lapping operation causes compressive stresses in the sensor 302. If the free layer 312 has a magnetostriction that is too positive and too large, this magnetostriction, when combined with the compressive stresses in the head sensor 302 will cause the free layer 312 to have an undesirable magnetic anisotropy that is oriented perpendicular to the air bearing surface. This magnetic anisotropy is undesirable because it tends to orient the magnetization 312 in a direction that is perpendicular to the air bearing surface rather than parallel with the air bearing surface. This causes free layer instability. During manufacture, steps can be taken to try to keep the magnetostriction as close to zero as possible or even negative. However, various manufacturing variances and other factors can still cause the free layer to have a positive magnetostriction and a resulting undesirable magnetic anisotropy.

The present invention provides a mechanism for determining whether the free layer 312 has such an undesirable magnetic anisotropy. As those skilled in the art will appreciate, the read head 302 is fabricated on a wafer 301 with many thousands of such read heads 302 being formed on a single wafer. With continued reference to FIG. 3, along with the read sensor 302, a test sensor 340 is also formed on the wafer 301. The number of test sensors 340 formed on the wafer is a matter of design choice. For example, there may be a test sensor 340 for each row of actual read sensors 302. Alternatively, there may be one or only a few test sensors 340 on the wafer.

With continued reference to FIG. 3, the test sensor 340 does not include the bias layers 332, 330 that were included in the actual read sensor 302. Instead, the space between the shields 306, 308 can be filled with an insulating material 342, 344 such as alumina. The test head 340 can be identical to the actual read sensor except for the absence of the bias layers 332, 334, leaving the test sensor 340 with a free layer 312 that is not biased. This test sensor 340 can then be used to measure the magnetic anisotropy of the free layer in the test sensor 340, which corresponds to the magnetic anisotropy of the actual read sensor 302.

In order to determine whether the processes used to manufacture the read sensor 302 has resulted in the free layer 312 having an unacceptable magnetic anisotropy, the wafer 301 with the read sensor 302 and test sensor 340 is placed into a testing tool to perform magnetic testing to produce a transfer curve for the test head 340. For the test sensor 340, transfer curves are measured with a series of externally applied stabilizing fields, mimicking the hard bias in an actual read sensor. The analysis to evaluate the process induced magnetic anisotropy involves tracking the coercivity of the transfer curves versus the applied stabilizing fields. Higher stabilizing fields are required to reduce the coercivity for a process that introduces high transverse anitsotropy. Lower stabilizing fields are required to reduce the coercivity for a process that introduces smaller transverse anisotropy.

Figure 4:
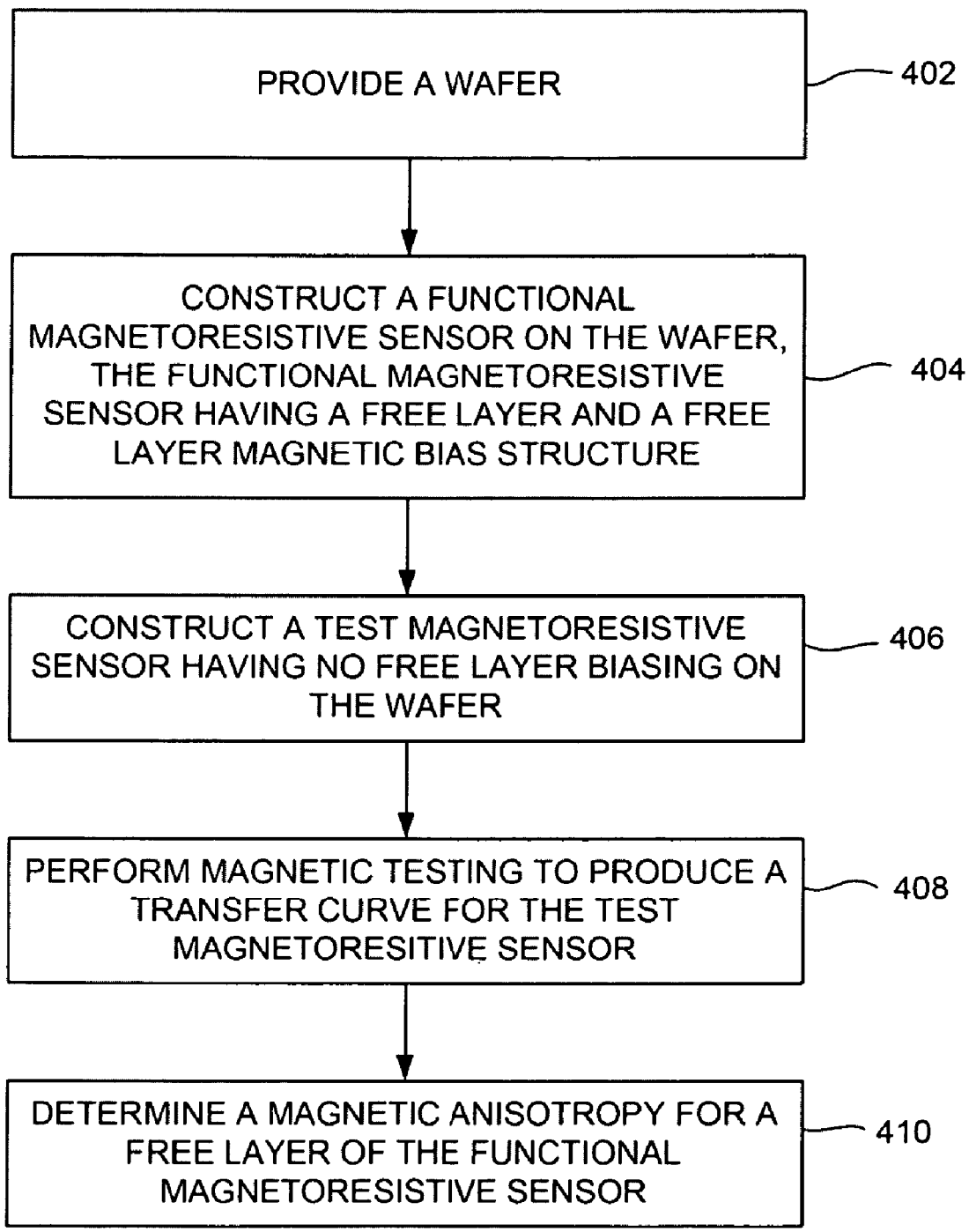
FIG. 4 is a flow chart illustrating a method for determining a magnetic anisotropy in a magnetoresistive sensor.

With reference now to FIG. 4, a process for determining the process driven magnetic anisotropy of a magnetic read head is summarized. In a step 402, a wafer is provided. This wafer can be, for example, a titanium carbide wafer suitable for use in producing sliders. Then, in a step 404 a functional magnetoresistive sensor is formed on the wafer, the functional magnetoresistive sensor is a sensor having a magnetic free layer and a magnetic free layer biasing structure such as hard bias layers or an in-stack bias structure. The functional magnetoresistive sensor can correspond to the sensor 302 described above with reference to FIG. 3 however the structure of the senor can be varied in a variety of ways. In a step 406 a test magnetoresistive sensor is formed on the wafer. The majority of the test sensor is formed simultaneously with the formation of the functional magnetoresistive sensor. The tests sensor can be identical to the functional sensor, except that the magnetic bias structure is removed.

Then, in a step 408 magnetic testing is performed to produce one or more transfer curves for the test sensor. The magnetic testing is performed by applying a series of magnetic fields to the test sensor while measuring the resistance across the sensor. In the case of a current perpendicular to plane sensor such as a tunnel valve sensor or CPP GMR sensor the resistance is measured across the sensor in a direction perpendicular to the planes of the sensor layers, such as between shield/leads 306, 308 of FIG. 3. The variation of free layer coercivity (Hc) verses applied magnetic field is monitored. In a step 410 a magnetic anisotropy of the free layer is determined based on the results of the magnetic testing. Free layer coercivity (Hc) will decrease with larger magnetic fields. A test sensor having larger process induced anisotropy will require higher magnetic fields to reduce the free layer coercivity (Hc). Conversely, a sensor having less process induced magnetic anisotropy will require lower magnetic fields to reduce free layer coercivity (Hc). In this way the magnetic anisotropy of the test head can be determined. Since the test sensor is essentially identical to the functional head except for the absence of a free layer bias structure, the free layer magnetic anisotropy of the test sensor corresponds to the free layer magnetic anisotropy of the functional sensor. In this way, therefore, the actual magnetic anisotropy of the functional sensor can be accurately and easily determined. If the free layer magnetic anisotropy is too large (i.e. outside of acceptable design parameters) the wafer can be scrapped. The manufacturing processes can then be varied to reduce free layer anisotropy in subsequent wafers. While the test has been described as being performed at wafer level, this testing could also be performed at row level, after the wafer has been sliced into rows of sliders. In that case, there would be at least one test head for each row of sliders. Device to device scatter in free layer coercivity (Hc) for multiple sensor devices can identify scatter in the process induced magnetic anisotropy. Monitoring device to device scatter requires measuring multiple test devices located at various locations on the wafer. To monitor long range variations (such as resulting from variations in ion milling, deposition or photo patterns) the test devices would be located throughout the wafer. On the other hand, to monitor short range variations (nearest neighbor variations) the test devices would be closely spaced.

Figure 5:
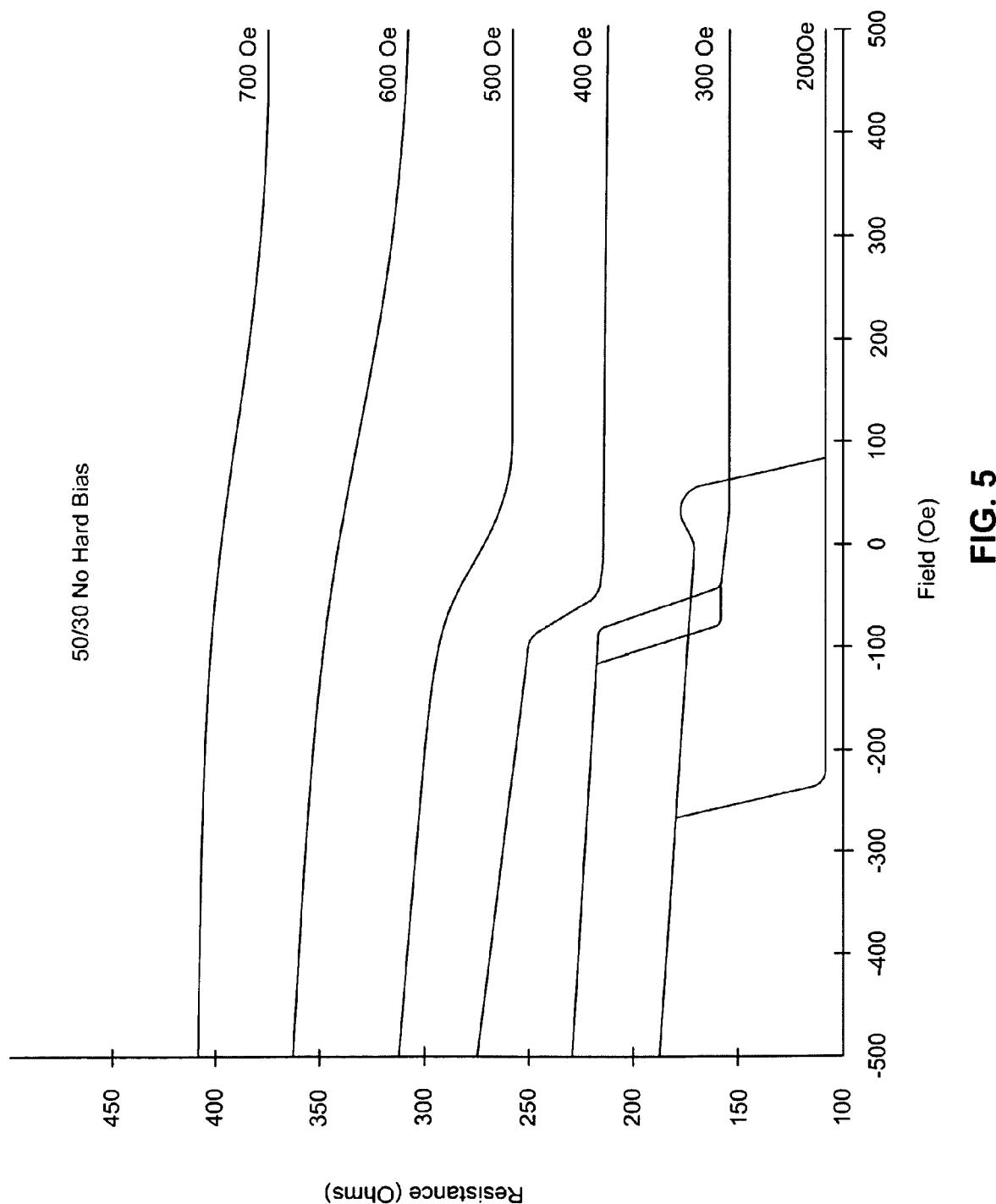
FIGS. 5-6 are examples of transfer curves for a test magnetic head.
Figure 6:
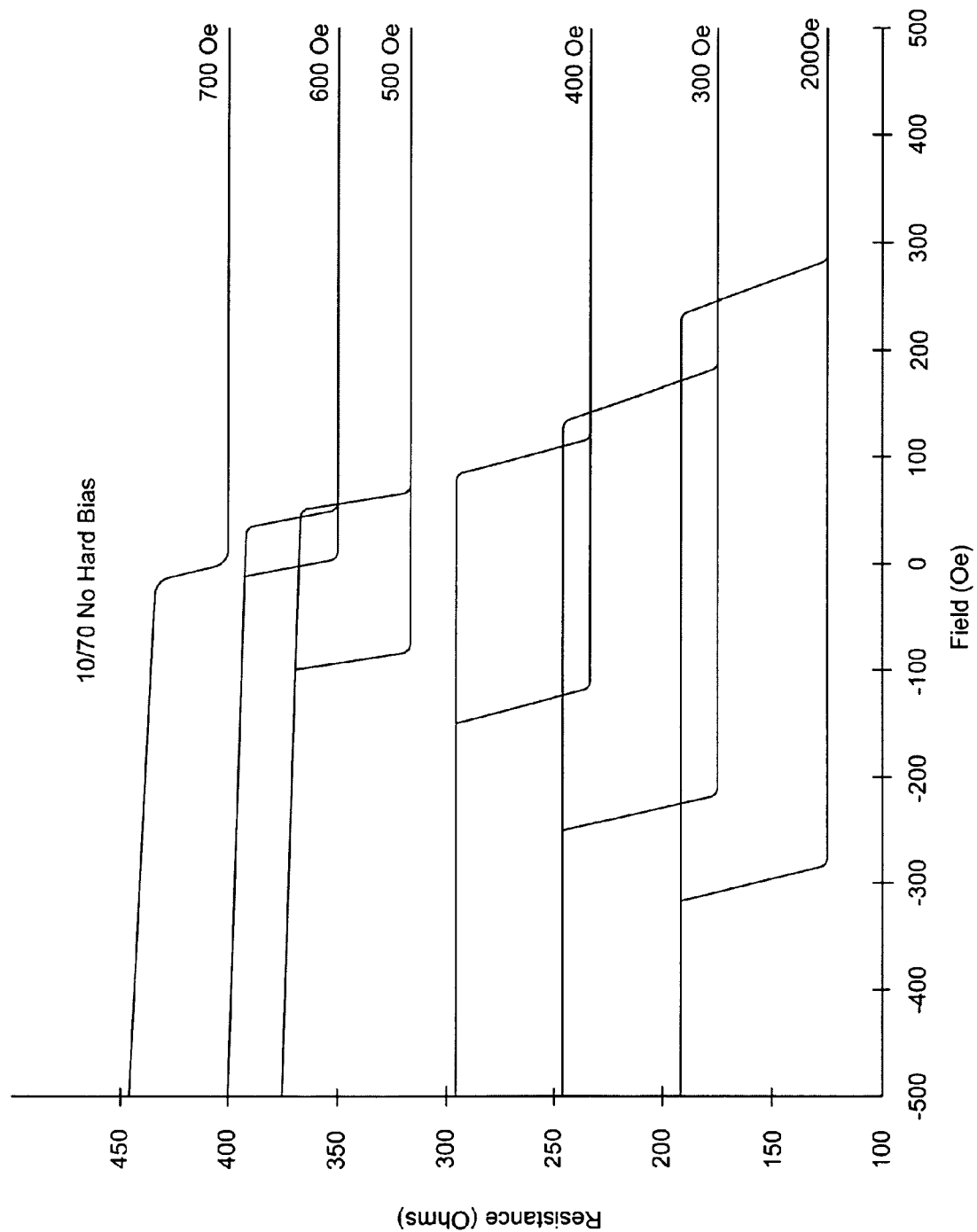

FIGS. 5 and 6 illustrate how the free layer coercivity can vary with process variation, specifically the milling conditions used to define the reader track width, and how that variation in coercivity can be detected using a test sensor according to the present invention. FIG. 5 relates to the coercivity of a free layer of a test sensor (ie. one with no hard bias) when the milling angles used to define the reader track width are 50 and 30 degrees. FIG. 6 shows a transfer curve for a sensor with a milling angles used to define the reader track width are 10 and 70 degrees. The differences in the transfer curves reflect the effect of processing on the sensor magnetic anisotropy, with the 10 and 70 degree milling condition producing more anisotropy compared to the 50 and 30 degree milling conditions.

While the graphs show the transfer curves for sensors with known process variations, this illustrates how such transfer curves compiled using a test head in a wafer can be used to determine the magnetic anisotropy of a free layer in an actual head, when the affects of process variations are unknown. In the manufacture of an actual head, variations in, for example, material composition, material thickness, etc. can affect the magnetic anisotropy of the actual head. Using, the transfer-curve for the test head, however, the effect of these variations can be accurately determined.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for determining process induced magnetic anisotropy in a magnetoresistive sensor, comprising:
   providing a wafer;
   forming a functional magnetoresistive sensor on the wafer;
   forming a test magnetoresistive senor on the wafer, wherein the functional magnetoresitive sensor has a magnetic free layer and a hard bias structure, and wherein the test magnetoresisitve sensor has a free layer but has no free layer bias structure; and
   performing testing on the test magnetoresistive sensor to construct a transfer curve for the test magnetoresistve sensor.

2. The method as in claim 1 wherein the forming a functional magnetoresistive sensor includes forming a functional magnetoresistive sensor stack, and wherein the forming a test magnetoresistive sensor includes forming a test sensor stack, and wherein the functional sensor stack and test sensor stack are formed simultaneously using common manufacturing processes.

3. The method as in claim 1 wherein the forming a functional magnetoresistive sensor includes forming a functional magnetoresistive sensor stack and forming first and second bias structures adjacent to the sensor stack, and wherein the forming a test magnetoresistive sensor includes forming a test sensor stack and depositing a non-magnetic fill layer adjacent to the test magnetoresistive sensor stack, the test magnetoresistive sensor having no adjacent hard bias structure, and wherein the functional sensor stack and test sensor stack are formed simultaneously using common manufacturing processes.

4. The method as in claim 1 wherein the performing testing comprises applying a magnetic field to the test sensor and, while the magnetic field is applied, measuring an electrical resistance across the test magnetoresistive sensor.

5. The method as in claim 1 wherein the performing testing further comprises applying a series of magnetic fields to the test magnetoresistive sensor and measuring an electrical resistance across the test magnetoresistive sensor during the application of each magnetic field.

6. The method as in claim 1 wherein the performing testing further comprises applying a series of magnetic fields to the test magnetoresistive sensor, measuring an electrical resistance across the test magnetoresistive sensor during the application of each magnetic field and producing a transfer curve for the test magnetoresistive sensor based on the magnetic fields and electrical resistance.

7. The method as in claim 1 wherein the testing further comprises applying a series of magnetic fields to the test magnetoresistive sensor in a direction perpendicular to an air bearing surface plane, and performing a series of electrical resistance measurements across the test magnetoresistive sensor to construct a transfer curve for the test magnetoresistive sensor and determining a magnetic anisotropy for the functional magnetoresistive sensor based on the transfer curve.

8. The method as in claim 1 wherein the testing further comprises performing testing to construct a transfer curve for the test magnetoresistive sensor and determining a magnetic anisotropy of the functional magnetoresistive sensor based on the transfer curve.

9. The method as in claim 1 further comprising constructing a transfer curve based on the results of the testing and determining a magnetic anisotropy of the functional magnetoresistive sensor, the method further comprising determining whether the magnetic anisotropy of the functional magnetoresistive sensor is within an acceptable design parameter.

10. The method as in claim 1 wherein the functional magnetoresistive sensor is a tunnel junction magnetoresistive sensor.

11. The method as in claim 1 wherein the functional magnetoresistive sensor is a current perpendicular to plane giant magnetoresistive sensor.

12. The method as in claim 1 wherein the functional magnetoresistive sensor is a current in plane giant magnetoresistive sensor.

* * * * *